United States Patent Office 3,075,856

Patented Jan. 29, 1963

3,075,856

COPPER PLATING PROCESS AND SOLUTION

Robert M. Lukes, Schenectady, N.Y., assignor to General Electric Company, a corporation of New York No Drawing. Filed Mar. 31, 1958, Ser. No. 725,450
11 Claims. (Cl. 117—47)

The present invention relates to a copper plating process and solution. More particularly, the invention relates to an autocatalytic chemical reduction process and a bath for plating the desired thickness of copper on objects having an active metallic surface. Still more particularly, this invention relates to an autocatalytic chemical reduction process and bath for plating the desired thickness of copper on objects having a catalytic metallic surface without simultaneously causing the plating of undesired surfaces and/or the precipitation of cuprous oxide from the solution.

Previously, it has been necessary to electroplate copper onto the surface of objects when it was desired to produce a relatively thick coating. While this method of copper plating is satisfactory for many purposes, it is objectionable in that it requires the use of rather elaborate and somewhat expensive electrical equipment, close control of the bath composition while being used, and, when it is desired to copper plate a non-metallic object such as a molded, laminated or otherwise shaped article containing a thermoplastic or thermo-setting resin, it is necessary to provide the plastic with a special conducting coating prior to the electroplating process. In the latter application, if there are discontinuous areas to be plated, it is necessary to provide an electrical contact to each one of the separate areas. In the making of printed circuit boards where there are many isolated areas on a single board to be plated, such a procedure is very time consuming and expensive. Furthermore, when electroplating articles with sharp edges, the electroplated copper tends to form a heavier coat at the sharp edges than it does on the plane surfaces. Also, it is every difficult to electroplate the walls of holes. These difficulties are obviated by the use of the copper plating processes and solutions forming the subject matter of this application.

There are known techniques for obtaining flash coatings of chemical plated copper. However, these techniques utilize chemical solutions which decompose spontaneously during the plating process. In order to obtain any substantial thickness of copper plate by these known techniques, it requires a great number of such flash coatings. Because the chemicals and the solutions used in these techniques are spent in forming each flash coating, the procedure is wasteful of chemicals, and hence too costly. Such a process not only plates the desired object with copper but also any other surfaces which are in contact with the solution during the plating operation including the container walls. Furthermore, a great deal of the copper in the solution is precipitated as cuprous oxide rather than plated as copper. These reactions are wasteful of the chemicals in the plating solution.

In a copending application of A. E. Cahill et al., Serial No. 610,401, filed September 17, 1956, and assigned to the same assignee as the present invention, now U.S. 2,874,072, there is disclosed and claimed an electroless method of copper plating wherein copper ion, complexed with tartrates or salicylates, and stabilized with a carbonate in an alkaline solution of definite hydroxyl ion concentration, is reduced with formaldehyde to produce a copper plate on a sensitized surface. Although this method produces satisfactory copper plating, the stability of the solution depends on the accurate control of many factors, as brought out in the specification. Also, the ingredients must be mixed in a precise order. Furthermore, the solutions are rather slow in starting and in plating copper. The present invention overcomes these problems.

It is an object of the present invention to provide new and improved, commercially practicable, copper plating solutions and processes for the autocatalytic chemical plating of copper.

Another object of the invention is to provide new and improved copper plating solutions and processes which are capable of plating thick coatings of copper in any desired pattern onto objects having any desired surface configuration or shape.

A still further object of the invention is to provide new and improved chemical copper plating solutions which are relatively stable and which do not decompose spontaneously during the plating action so that a consecutive series of objects may be plated in the solution until the copper is exhausted from the solution.

A still further object of this invention is to provide copper plating solutions and processes which plate only upon preselected, sensitized surfaces.

A still further object of this invention is to provide copper plating solutions and processes having the above listed characteristics which do not require elaborate electrical or other equipment for use in conjunction therewith.

These and other objectives, which will be obvious to those skilled in the art, are obtained by the methods described in the following detailed description.

My plating solutions comprise an aqueous solution having a pH of 10 to 14 containing formaldehyde and a cupric ion complex of an ethyleneaminoacetic acid selected from the group consisting of diethylenetriaminepentaacetic acid and 1,2-cyclohexylenediaminetetraacetic acid.

The complexing agents used in my invention have the following structural formulae:

(1) Diethylenetriaminepentaacetic acid

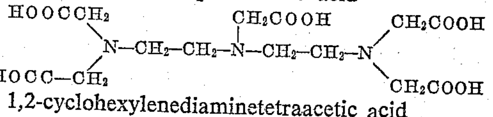

(2) 1,2-cyclohexylenediaminetetraacetic acid

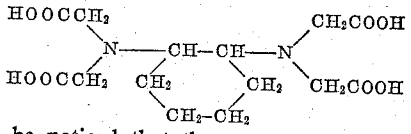

It will be noticed that these two complexing agents have a common chemical structure in that they are both poly-(tertiaryamino) compounds containing at least two tertiary amino groups which are separated from each other by a saturated acetylenic group (—CH—CH—)

Furthermore, each terminal amino group has two carboxymethyl groups and the non-terminal amino group has one carboxymethyl group. As far as I can determine, it is this combination of structure which is common to these compounds and the pH effect that imparts the stability and ability to rapidly plate a smooth, adherent copper plate to my solutions. Therefore, other chemicals having this combination of structure would be expected to be suitable for the same purpose. As far as I am aware, the only other known compound which has a similar structure is o-phenylenediaminetetraacetic acid:

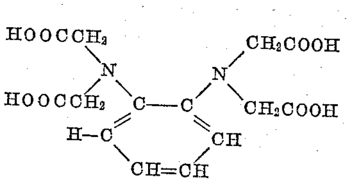

However, this compound does not duplicate the above structural similarities because of the aromatic ring. The aromatic ring suppresses the basicity of the amino groups and also their ability to form as stable a complex with cupric ion as the aliphatic series of compounds of my invention. Although this aromatic compound can be used, the plating results and stability are definitely inferior to the results obtained by use of my complexing agents.

The components of my plating solution can be mixed in any order desired, for example, the copper salt can be added to the base to precipitate cupric hydroxide and the desired ethyleneaminoacetic acid complexing agent added, or the copper can be added to the complexing agent or added as a preformed cupric complex and the base added thereafter, or the copper salt can be added to a mixture of the complexing agent and base.

As will be evident to those skilled in the art, those carboxyl groups of the complexing agent which are not used in complexing the cupric ion will react with the base to form salts. Therefore, rather than starting with a free acid I may start with the salt of the complexing agent, whereby one or more of the carboxyl groups have been reacted with a cation which may be the same or different from the cation of the base used in making the plating solution. The only requirement for the cation forming the salt is that it must not form a complex more stable than the cupric ion does with the ethyleneaminoacetic acid complexing agent, since, in such a case, the complexing agent is unable to react with the cupric ion. Because of this, I prefer to use bases for forming salts of the complexing agent as well as in obtaining the desired pH in the plating baths whose cation is, at most, only slightly complexed by the complexing agent. Such metallic cations are conveniently grouped as alkali metals in the periodic system. Therefore, the bases I prefer to use are, for example, lithium, sodium, potassium, rubidium and cesium hydroxides. Carbonates and bicarbonates can be used in forming the salts of the complexing agents, but are not strong enough bases to produce the desired pH range. The alkaline earth metal hydroxides, e.g., calcium, barium and strontium hydroxides can also be used. However, their solubility in water is not as great as the alkali metal hydroxides, and their cations form more stable complexes with the complexing agent. Of all the metallic hydroxides, I prefer sodium or potassium hydroxide. Of the nonmetallic hydroxides, I prefer the tetraalkyl ammonium hydroxides, such as the tetramethyl amonium hydroxide, diethyl, dimethyl amonium hydroxide, tetraethanol ammonium hydroxide, tetraethyl ammonium hydroxide, tetrabutyl ammonium hydroxide, and the like.

Any cupric salt may be used, providing it is capable of supplying cupric ions to form the complex. Readily available copper salts which I may use are: cupric sulfate, cupric chloride, cupric nitrate, cupric acetate, cupric hydroxide, and so forth, there being nothing critical as regards the anion associated with copper other than it should not decrease the cupric ion concentration in the solution below the level where it can form the complex, as mentioned above. Cupric sulfate represents the lowest cost, most readily available copper salt and is preferred only for this reason.

The chemical equation expressing the plating reaction can be written in the following form:

$$\text{(I)}\quad Cu^{++}+4OH^{-}+2HCHO \rightarrow Cu^{\circ}\downarrow +2HCOO^{-}+H_2\uparrow+2H_2O$$

From an examination of this equation, the following facts will be evident to those skilled in the art:

(1) The particular anion associated with the copper and the particular cation associated with the hydroxyl ion are both immaterial as regards to entering into the reaction. However, since the reaction is ionic, the particular anion associated with the copper and the particular cation associated with the hydroxyl ion should not be such that they prevent ionization. Stated another way, they should not form such aqueous insoluble compounds that no copper ions or hydroxyl ions are available for reaction.

(2) Under ordinary conditions, the cupric ion and the hydroxyl ions would form cupric hydroxide, an insoluble compound. A function, therefore, of the complexing agent is to so complex the cupric ion that it cannot react with the hydroxyl ion, yet will be available for the reducing action indicated whereby it is reduced to metallic copper.

(3) Hydrogen is a by-product of this reaction and normally will tend to collect on the surface of the article being plated with copper causing the copper to plate in a spotty and irregular coating. This effect can be minimized by having present in the plating reaction, materials known to reduce the surface tension of water, such as alcohols and surfactants.

Although I have tried other aldehydes, e.g., benzaldehyde, acetaldehyde, etc., only furfuraldehyde will give any copper plating and it is decidedly inferior to the results I obtain with formaldehyde. In place of formaldehyde, materials engendering formaldehyde, e.g., paraform-aldehyde, may be used.

Although not evident from the above equation, the particular complexing agents of this invention provide a further benefit to the plating solution in that they prevent the plating reaction occurring unless a sensitizing metallic surface is also present in the reaction solution. By a sensitizing metallic surface, I mean any surface containing a visible or invisible film of a metal capable of causing my solution to plate copper. These surfaces can be massive pieces of metal, or they can be visible or invisible metallic films on a non-metallic substrata. It will be evident to those skilled in the art that my plating solution can be used for two purposes; it can be used to copper plate pieces of metal or it can be used to copper plate non-metallic surfaces. Almost any clean metal surface which is not reactive with alkaline aqueous solutions will act as a sensitizing metallic surface and may be plated with copper by merely bringing the metallic surface in contact with the plating solution. Although metallic surfaces which are reactive with alkaline solutions can be plated with my solutions, the plate is not smooth and adherent because of the reaction of the metal with the solution, to produce hydrogen. Since oils, greases, dirt, and other films would prevent proper wetting of the metallic surface, they should be removed prior to the plating process, unless they are used purposely to mask and prevent plating of certain areas when it is desired to copper plate controlled areas to produce a design or pattern. Typical metallic surfaces which can be copper plated by my process include iron, cobalt, nickel, gold, silver, platinum, palladium, rhodium, tin, copper, etc., including alloys such as carbon steels, stainless steels, Monel, the karat golds, sterling and coin silver, platinum-iridium alloys, etc.

It is necessary to provide non-metallic surfaces to be copper plated by my solutions with a coating of a sensitizing metal. Although any of the above-named metals can be used to form the sensitizing metallic surface, from a practical standpoint it is only possible conveniently to provide the non-metallic surface with a sensitizing metal selected from the group consisting of nickel, cobalt, copper, rhodium, silver, gold, platinum and palladium. It is preferable to roughen the non-metallic surface by either chemical or mechanical means, such as chemically etching, roughening by solvent attack, sand-papering, sandblasting, and the like. This roughening process not only removes any invisible film which might prevent the plating of the copper but it also enables the sensitized metal and the copper plate to be anchored more firmly and to be more adherent than they would be if this step were omitted. Treating of the roughened surface with a stannous chloride solution followed by washing with water and treating with a solution of a silver, gold, platinum, rhodium or palladium salt will provide an invisible film of the particular metal used.

The stannous chloride treatment may be omitted if the silver or other noble metal salt is not very soluble in the plating solution. In this case the salt is dissolved in a material which is a good solvent for the salt. This solution is used to treat the surface to be plated. When brought in contact with the plating solution, the formaldehyde will reduce the salt to the metal and form a sensitized surface on which the copper will plate. Salts of organic acids such as acetic, proprionic, butyric, oleic, palmitic, stearic, naphthenic, benzoic, naphthoic, etc., are ideal for this application. They can be dissolved in benzene, toluene, xylene, or other organic solvent, to form a solution to be used as outlined above. The solutions can be extremely dilute, e.g., 1% by weight of salt, and are preferred over more concentrated solutions. Best results are obtained when the solvent for the silver salt also has a slight solvent effect on the material being sensitized. A quick rinse with pure solvent removes the excess silver salt on the surface which will tend to cause a weakly adherent copper plate if not removed. A film of silver or copper may be formed on the non-metallic surface using the well known "silver mirror" techniques. Metallic films can also be formed by decomposition of metallic hydrides or vacuum metallizing techniques. Once any of the above metallic coatings have been formed on the non-metallic surface, nickel or cobalt coatings can be formed on the primary metal surface by the method of Brenner and Riddell, "Journal of Research of the National Bureau of Standards," 39, 385–395 (1947), entitled, "Deposition of Nickel and Cobalt by Chemical Reduction." Normally, the additional process step and the expense of providing nickel and cobalt coatings do not warrant such a procedure, since a single sensitizing coating gives very satisfactory results. Once the sensitized coating is on the non-metallic surface, either as a visible or invisible film, it can be brought in contact with my plating solution without further treatment to obtain the desired thickness of copper plate.

It will be noticed that copper itself is a sensitizing metal for my plating solution. Therefore, the primary film of sensitizing metal, needed to initiate the plating of copper, can be extremely thin. All that is required of the primary film is for it to form a thin film of copper over the entire desired area. Once this is accomplished, the process is autocatalytic since any copper film will cause additional copper to plate out. As long as the chemical conditions are as specified, the plating reaction continues until either the surfaces being plated are removed or the copper ion is exhausted from the solution. The autocatalytic nature of the plating reaction permits the object to be removed from the plating solution and examined to determine the thickness and quality of the plate, and to clean any areas which might not be plating properly, without having the plating reaction continue, thereby wasting the reagents. Furthermore, if copper did not catalyze the reaction it would be impossible to build up a thick plate of copper without resensitizing the surface many times. The ability to form a thick copper plate is a necessary requirement for solutions that are used to produce copper films which must have low electrical resistance and high current carrying capacity without becoming overheated, for example, printed electrical circuits.

In an alkaline formaldehyde solution, a competing reaction to the plating reaction shown by Equation I occurs and is illustrated by:

$$\text{(II)}\quad 2Cu^{++}+5OH^{-}+HCHO \rightarrow Cu_2O\downarrow+HCOO^{-}+3H_2O$$

This reaction is non-catalytic and will occur in the absence of sensitizing metals. In the presence of my complexing agents, the reaction is subordinate to the plating reaction but it is influenced by temperature and the concentration of cupric ion. The cuprous oxide precipitate formed in this reaction is reduced by the alkaline formaldehyde to copper metal which will initiate the autocatalytic copper plating reaction. Therefore, the stability of my plating solution depends on maintaining the solution free of precipitated copper and cuprous oxide. To insure maximum stability, the minimum quantity of the other ingredients making up my plating bath is dependent on the amount of copper salt used. Excess of the other reagents over that required can be used except for the amount of base which is limited by the requirement that the pH of the solution must be in the range of 10 to 14. There must be present at least one mole of the complexing agent for each mole of copper. However, if there are other competing ions in the solution which form complexes, a greater amount of complexing agent is required, but usually no more than two to three moles of complexing agent needs to be used for each mole of copper, the exact stoichiometric amount being dependent on the metallic ion added as the base or present as the metallic ion forming the salt with the complexing agent. If the base and the salt forming group for the complexing agent have a sodium, potassium or a quaternary ammonium cation, only one mole of complexing agent will be needed for each mole of copper, since these ions do not noticeably interfere with the formation of a stable copper complex by the complexing agents used in my solution, although these ions do form salts with the carboxyl groups. Because they are readily available, easy to use, and do not require an excess amount of complexing agent, I prefer to use sodium, potassium, or a quaternary ammonium hydroxide as both my source of base and salt-forming cation of the complexing agent.

The amount of base used is dependent on whether or not the complexing agent has been added as the free acid or whether it is added as the pre-formed salt. No excess base needs to be added if the complexing agent has been added as a pre-formed salt whereby all of the carboxylic acid groups have been neutralized with a base to form salts. Otherwise, one mole equivalent must be used for each free, unneutralized carboxylic acid group. Enough base must be added to neutralize any acidity of the formaldehyde. In addition, four equivalents of base must be used for each mole of copper used. This is the stoichiometric amount as shown by Equation I. However, in order to maintain the desired pH, I may use up to 6 equivalents of base. My experiments have shown that it is preferable to use only that amount exceeding 4 equivalents which is necessary to maintain the pH in the lower region of the specified pH range during the plating reaction, rather than to operate in the higher region.

There should be at least two moles of formaldehyde used for each mole of copper, but larger excesses can be used with no deleterious results. However, for economy and ease of controlling the reaction, I prefer not to have an extremely large excess of formaldehyde in the solution. The formaldehyde can be added all at one time or added stepwise or continuously during the plating reaction.

In addition to the above-desired molar proportions of the reactants, I have also found that the rate of formation of the plating coating as well as the length of time the solution is stable without a precipitate forming is dependent upon the molar concentration of copper. As Table I shows, the plating rate increases and the solution life decreases as the copper ion increases in molar concentration. In the table, solution life, which is a measure of stability, is defined as the length of time that the solution will stand in the absence of a sensitizing metal before precipitating copper metal and evolving hydrogen. Several methods are available for lengthening this solution life, one of which is to remove the precipitated cuprous oxide or copper by continuously filtering the solution to remove the precipitate. Reducing the temperature of the plating solution increases the solution life.

Another method is to continuously bubble air or oxygen through the solution. This latter process is disclosed and claimed in a copending application of Maynard C. Agens, Serial No. 725,451, filed concurrently herewith, and assigned to the same assignee as the present invention, now U.S. 2,938,805. By this method, the bubbling of a fine stream of oxygen containing gas through a well-agitated solution is capable of increasing the life of a solution for at least three or four times and usually 30 to 40 times its normal life.

TABLE I

*Variation of Rate of Copper Deposition and Plating Solution Stability with Cupric Ion Concentration*

| Copper Ion Concentration | Rate of Deposition, Mils/hour | Solution Life |
|---|---|---|
| 0.05 M | 0.07 | 3 days. |
| 0.10 M | 0.12 | 2.5 hours. |
| 0.20 M | 0.25 | 0.5 hour. |

For a given solution, the total rate at which copper is deposited is directly proportional to the catalytic surface area. Therefore, it is advantageous to plate on as large an area as possible per volume of plating solution. This depletes the solution of copper before serious decomposition occurs and increases the volume efficiency. This is an especially useful technique, therefore, to use with the more concentrated plating solutions.

The plating rate is affected not only by cupric ion concentration and the ratio of catalytic surface area to volume of solution, but also by the temperature of the solution. As the temperature is increased the plating rate also increases. Unfortunately the decomposition reaction to form cuprous oxide also increases with temperature. Therefore, for best results I prefer not to have the temperature of my plating solutions exceed 50° C. and usually not to exceed 35° C. The temperature can be as low as the freezing point of the solution, but I have not found any benefit to be gained by operating at such low temperatures. Normally I prefer to have the temperature no lower than 10° C. and usually no lower than 15° C. Completely satisfactory results are obtained by operating at ambient temperature, e.g., 20–30° C. When using large volumes of plating solution, the exothermic nature of the plating reaction produces enough heat that it is sometimes necessary to cool the solution, e.g., with cooling coils through which cold water or refrigerant is circulating.

When operating at ambient temperature (20–30° C.) with plating solutions containing cupric ion in the range of 0.05 to 0.2 molar and the amount of copper in solution is in large excess of that plated out, I will obtain plating rates in the range of 0.05 to 0.5 mil per hour. The final thickness I can obtain is not limited by the ability of my solutions to produce a thicker coat, but by the practical aspect that, if the coefficients of expansion of the copper and substrate are not matched, an extremely thick plate of copper (e.g., 10 mils or thicker) will pull away from the substrate if subjected to repeated heating and cooling cycles. Normally I have found 3–4 mil copper coatings to be thick enough for all practical applications although thicker coatings can be produced.

As will be evident, there must be at least as much copper in solution as is required to plate the desired area with the desired thickness. The minimum volume of solution required to produce a desired thickness is a function of the cupric ion concentration. When using low copper concentration or the Agens stabilizing technique, it is possible to use large volumes, carrying out the plating of one batch of articles until the desired thickness of copper is attained and then adding subsequent batches of articles to be plated.

A wetting agent improves the equality of the copper plate laid down. It accomplishes this by reducing the size of the hydrogen bubbles given off and by facilitating maximum penetration of the plating solution into the cracks and crevices of the substrate. Almost any surfactant can be used, such as for example, the non-ionic, the quaternary ammonium salt, the alkyl phenol sulfonate, and the alkyl sulfate types of surfactants. Sodium lauryl sulfate is a relatively inexpensive, easily available material which I have found particularly useful.

For best operation of the plating bath, agitation and filtration are highly desirable. Agitation, in addition to maintaining uniform concentration, helps to detach the hydrogen bubbles from the surface being plated, thereby giving a better quality plate and preventing streaking of the areas where plating is undesired.

Filtration removes loose copper particles and cuprous oxide from the solution, thereby minimizing solution decomposition and extraneous plating. Some of the loose copper particles probably are caused by copper being torn from the surface by the evolved hydrogen gas. This is particularly noticeable when concentrated plating solutions are used.

In practice, filtration and agitation can be combined. A pump circulates the solution through a filter and this creates sufficient stirring of the plating bath.

Since the copper plate laid down by my process has only a mechanical bond to the non-metallic substratum, the adhesion is a function of the roughness and wettability of the surface of the plating solution. Consequently, adhesion to a polished or extremely hydrophobic surface which is repellent to the plating solution is nil, while adhesion to a porous, rough, wettable surface is very good.

In practice, for non-metallic substrata comprising a shaped article containing (1) a synthetic resin such as laminated or molded phenolic, alkyd, silicone, ethenoid, etc., resins, or (2) a high-gloss surface such as glass and the like, a light sand-blast before sensitization provides excellent adhesion. In those cases where silicone resins are present an alkali soak (e.g., a 5% aqueous sodium or potassium hydroxide solution) has proved desirable before sensitizing the surface with the metal film. Porous materials, such as unglazed ceramics, require no surface preparation before sensitization other than to insure that they are clean and wettable by the sensitizing and plating solutions. The degree of adhesion obtained on non-metallic surfaces is apparently also dependent on the ease with which the surface is wetted by the plating solution. Those surfaces containing materials which easily absorb water, such as cellulose fibers, form very strong bonds with the copper plate.

Selectivity is the ability to plate where it is desired while not plating areas where it is not desired. This can be achieved in two ways: (1) only the areas to be plated are sensitized, (2) the whole item is sensitized and the areas not to be plated are masked with a resist. The latter method is easier to accomplish and is more reproducible. Silk screen techniques can be used to readily mask intricate patterns or designs on the surface. A solution of polystyrene in toluene or xylene gives exceptionally good results when used to make the resist. It can be thickened and colored by incorporating dyes, pigments, and fillers well known in plastics and paint manufacture, e.g., carbon black, silica, lithopone, lead oxide, zinc oxide, iron oxide, zinc, chromate, titanium dioxide, etc. Not only is it water-repellent and alkali resistant, but it is easily removed when desired. Most polyester resins, nitrocellulose lacquers, and resins containing polyvinyl alcohol are too readily penetrated by the highly alkaline solution to function satisfactorily as resists. In order that those skilled in the art may better understand how my invention may be carried into effect, the following examples, carried out at the ambient temperature, are given by way of illustration, and not by way of limitation.

EXAMPLE 1

One liter of solution containing the following ingredients in the concentrations specified was prepared:

| | Molarity |
|---|---|
| Cupric sulfate | 0.10 |
| Diethylenetriaminepentaacetic acid | 0.10 |
| Potassium hydroxide | 0.90 |
| Formaldehyde | 0.30 |

A piece of sand-blasted paper base phenolic resin laminated board was dipped into a stannous chloride solution prepared by dissolving 10 grams of stannous chloride and 20 milliliters of 12 molar hydrochloric acid in sufficient water to make one liter. It was allowed to remain in the solution for 1 minute, removed, rinsed in running water, and then dipped for 1 minute in a palladium chloride solution made by dissolving 0.5 gram of palladium chloride in 10 milliliters of 12 molar hydrochloric acid, and diluting with water to 1 liter. After removal from the palladium chloride, the board was rinsed with running water and placed in the above solution. A rapid evolution of hydrogen ensued at once from the surface of the board, and copper deposited upon the surface simultaneously.

EXAMPLE 2

A solution containing the following ingredients in the concentrations specified was prepared:

| | Molarity |
|---|---|
| Cupric sulfate | 0.10 |
| N,N,N',N'-tetra-(carboxymethyl)-1,2-cyclohexylenediamine | 0.10 |
| Potassium hydroxide | 0.80 |
| Formaldehyde | 0.30 |

Into 250 ml. of this solution was placed a strip of paper base phenolic resin laminate board which had been sand-blasted, was sensitized by dipping in an acidic 1% stannous chloride solution described in Example 1, rinsed with water, dipped in an aqueous 1% silver nitrate solution, and again rinsed with water. When this board was placed in 250 ml. of the above solution a rapid evolution of hydrogen gas began immediately from the board surface, and copper plated thereon simultaneously. N,N,N',N' - tetra - (carboxymethyl) - 1,2 - cyclohexylenediamine is an alternative and more specific name for 1,2-cyclohexylenediamine tetraacetic acid.

When non-metallic boards having holes punched therein are plated using my plating solutions, it is found that the copper plates on all of the unmasked sensitized surfaces, including the walls of the holes, and does not build up at the sharp edges. My solutions can be used, therefore, to produce printed circuits wherein electrical contact is desired between the two surfaces.

From the foregoing description, it can be seen that the present invention provides a commercially practicable chemical copper plating solution and process for the chemical plating of copper on catalytic reactive metallic surfaces or non-metallic materials which have been sensitized with a visible or invisible film of metal. By means of this invention, relatively thick coatings of copper may be plated on the surface. However, should it be desired to do so, once the copper coating has been formed, the standard electroplating procedure can be used to plate additional copper.

The above examples have illustrated many of the modifications and variations of the present invention, but obviously other modifications and variations of the present invention are possible in light of the above teaching. It is therefore to be understood that changes may be made in the particular embodiments of the invention described which are within the full intended scope of the invention as defined by the appended claims.

What I claim as new and desire to secure by Letters Patent of the United States is:

1. A solution for the autocatalytically plating of copper on an active metallic surface which comprises formaldehyde and an aqueous solution having a pH in the range of 10 to 14 containing the cupric ion complex of an ethyleneaminoacetic acid selected from the group consisting of diethylenetriaminepentaacetic acid and 1,2-cyclohexylenediaminetetraacetic acid.

2. The solution is in claim 1 wherein the cupric ion is complexed with diethylenetriaminepentaacetic acid.

3. The solution as in claim 1 wherein the cupric ion is complexed with 1,2-cyclohexylenediaminetetraacetic acid.

4. The solution as in claim 1 wherein the pH of the aqueous solution is obtained by using a base selected from the group consisting of sodium hydroxide, potassium hydroxide and tetraalkylammonium hydroxides.

5. The solution as in claim 4 wherein the base is sodium hydroxide.

6. The solution as in claim 4 wherein the base is potassium hydroxide.

7. The solution as in claim 4 wherein the base is tetraethylammonium hydroxide.

8. The solution as in claim 1 wherein the copper is present in a concentration of from 0.05 to 0.2 molar.

9. The process of autocatalytically plating copper which comprises contacting an active metallic surface with the solution of claim 1.

10. The process as in claim 9 wherein the active metallic surface is palladium.

11. The process of autocatalytically plating copper on a non-metallic substratum which comprises forming a film of a metal selected from the group consisting of nickel, cobalt, copper, silver, rhodium, gold, platinum, and palladium on the surface of the non-metallic body, and thereafter contacting the sensitized non-metal with the solution of claim 1.

References Cited in the file of this patent

UNITED STATES PATENTS

| | | |
|---|---|---|
| 2,396,938 | Bersworth | Mar. 19, 1946 |
| 2,454,610 | Narcus | Nov. 23, 1948 |
| 2,759,845 | Hilemn | Aug. 21, 1956 |
| 2,776,918 | Bersworth | Jan. 8, 1957 |
| 2,819,187 | Gutzeit et al. | Jan. 7, 1958 |
| 2,871,139 | Wein | Jan. 27, 1959 |

FOREIGN PATENTS

| | | |
|---|---|---|
| 604,644 | Great Britain | July 7, 1948 |

OTHER REFERENCES

Martell and Calvin: Chemistry of the Metal Chelate Compounds, 1952, p. 536, printed by Prentice-Hall Inc.

Marboe et al.: The Glass Industry, vol. 26, No. 3, March 1945, pp. 119, 120, 136–138, 142, 149.

Narcus: Metal Finishing, vol 50, No. 3, March 1952, pp. 54–62.